(12) United States Patent
Deus et al.

(10) Patent No.: US 8,741,669 B2
(45) Date of Patent: Jun. 3, 2014

(54) METHOD FOR THE PRODUCTION OF AN ORGANIC LIGHT EMITTING ILLUMINANT

(75) Inventors: Carsten Deus, Dresden (DE); Joerk Richter, Dresden (DE); Ruben Seifert, Dresden (DE); Lutz Gottsmann, Grossroehrsdorf (DE)

(73) Assignee: VON ARDENNE Anlagentechnik GmbH, Dresden (DE)

( * ) Notice: Subject to any disclaimer, the term of this patent is extended or adjusted under 35 U.S.C. 154(b) by 0 days.

(21) Appl. No.: 13/990,661

(22) PCT Filed: Dec. 7, 2011

(86) PCT No.: PCT/EP2011/072035
§ 371 (c)(1),
(2), (4) Date: Jul. 23, 2013

(87) PCT Pub. No.: WO2012/076587
PCT Pub. Date: Jun. 14, 2012

(65) Prior Publication Data
US 2013/0295707 A1    Nov. 7, 2013

(30) Foreign Application Priority Data

Dec. 7, 2010 (DE) .......................... 10 2010 053 605
May 2, 2011 (DE) .......................... 10 2011 075 092

(51) Int. Cl.
*H01L 51/56* (2006.01)
*H01L 21/00* (2006.01)

(52) U.S. Cl.
USPC ............................................. 438/22; 438/99

(58) Field of Classification Search
CPC ........................................................ H01L 51/56
USPC .................................................. 438/22, 46, 99
See application file for complete search history.

(56) References Cited

U.S. PATENT DOCUMENTS 6,716,656 B2 * 4/2004 Shtein et al. .................... 438/24
7,049,757 B2   5/2006 Foust et al.
(Continued)

FOREIGN PATENT DOCUMENTS

JP      10335068 A      12/1998
JP   20022535822 A      10/2002
(Continued)

OTHER PUBLICATIONS

International Search Report for PCT/EP2011/072035 dated Apr. 18, 2012.

(Continued)

*Primary Examiner* — Savitr Mulpuri
(74) *Attorney, Agent, or Firm* — Heslin Rothenberg Farley & Mesiti P.C.

(57) ABSTRACT

In a method for producing an organic light emitting illuminant, a base electrode layer is formed over a substrate, an organic light emitting layer is formed over at least one portion of the base electrode layer, and a top electrode layer is formed over at least one portion of the organic light emitting layer, the layers being formed in the shape of strips. The strip-shaped formation of the layers is carried out in a coating process in an in-line vacuum coating system having stationary shadowing masks on the advancing substrate such that at least one area of the base electrode layer remains uncoated once the layers have been formed.

16 Claims, 2 Drawing Sheets

(56) References Cited

U.S. PATENT DOCUMENTS

| | | | |
|---|---|---|---|
| 7,214,554 B2* | 5/2007 | Winters et al. | 438/21 |
| 7,288,426 B2* | 10/2007 | Geyer | 438/63 |
| 7,547,562 B2* | 6/2009 | Ogino | 438/22 |
| 7,682,660 B2* | 3/2010 | Shtein et al. | 427/255.6 |
| 8,053,260 B2* | 11/2011 | Foust et al. | 438/28 |
| 2005/0236975 A1 | 10/2005 | Addington et al. | |
| 2005/0239294 A1 | 10/2005 | Rosenblum et al. | |
| 2006/0057750 A1 | 3/2006 | Aoki et al. | |

FOREIGN PATENT DOCUMENTS

| | | |
|---|---|---|
| JP | 2009295822 A | 12/2009 |
| JP | 2010-263155 A | 11/2010 |
| WO | 2008088932 A1 | 7/2008 |

OTHER PUBLICATIONS

Office Action issued for corresponding Japanese patent application No. 2013-541390 dated Nov. 25, 2013.

* cited by examiner

Transport direction

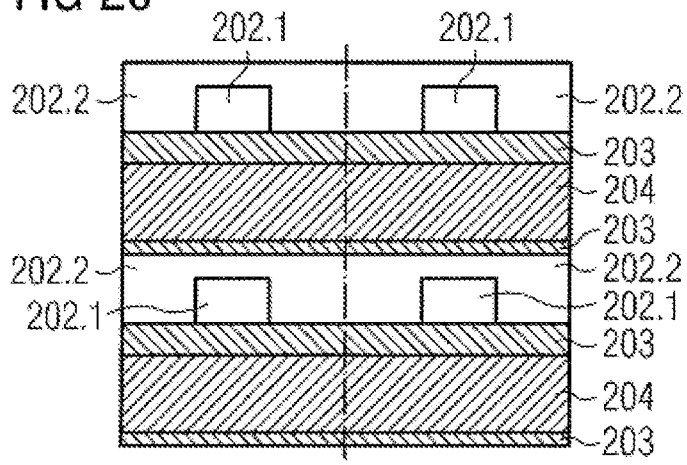
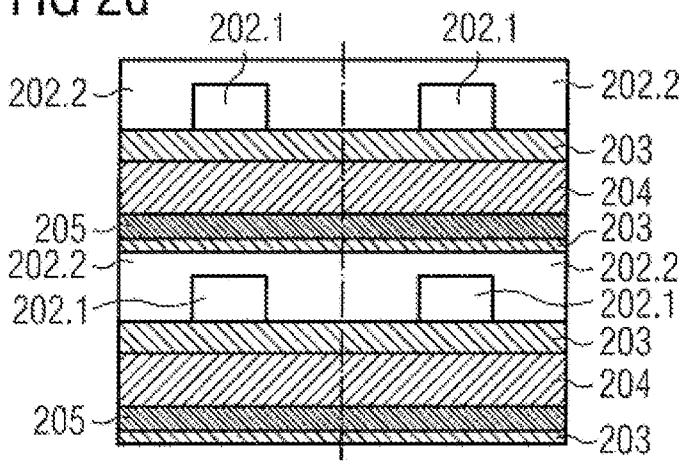
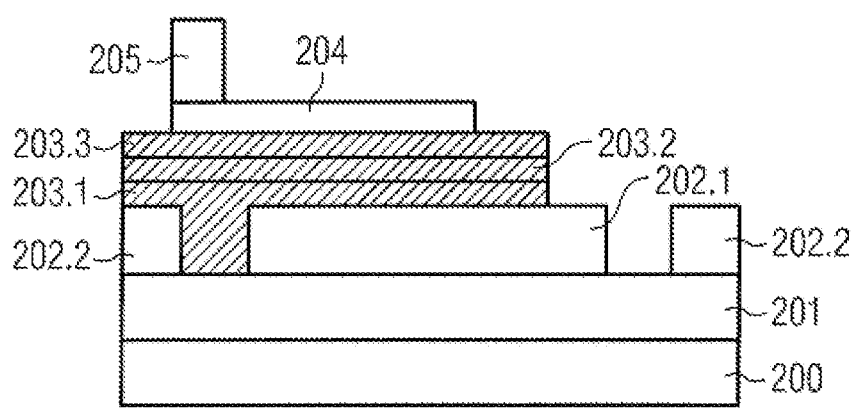

METHOD FOR THE PRODUCTION OF AN ORGANIC LIGHT EMITTING ILLUMINANT

CROSS REFERENCE TO RELATED APPLICATIONS

This application is a national stage filing under section 371 of International Application No. PCT/EP2011/072035 filed on Dec. 7, 2011, and published in German on Jun. 14, 2012 as WO 2012/076587 A1 and claims priority of German patent application No. 10 2010 053 605.9 filed on Dec. 7, 2010, and German patent application No. 10 2011 075 092.4 filed on May 2, 2011, the entire disclosure of these applications being hereby incorporated herein by reference.

BACKGROUND ART

The present invention relates to a method for the production of organic light emitting illuminants, in particular organic light emitting diodes.

Organic light emitting illuminants, in particular organic light emitting diodes (OLEDs), are currently already used in many areas of consumer electronics, for example in display applications, and are also regarded as a future technology in the lighting sector. An OLED structure contains one or more organic light emitting layers (EML) arranged between two electrodes, for example a cathode and an anode on a substrate. Since, for the OLED structure, the mobility and thus the current density differ for electrons and holes, since the mobility of the holes in organic semiconductors in comparison is two orders of magnitude greater than the mobility of the electrons, an OLED usually additionally has two layers, a hole transport layer (HTL) and an electron transport layer (ETL), the task of which is to transport holes and electrons into the emission zone.

FIG. 1 illustrates a schematic construction of an OLED known from the prior art. It consists of a substrate 100, on which an optionally smoothing layer 101, an anode layer 102, a hole transport layer 103 (HTL), at least one emission layer 104 (EML), an electron transport layer 105 (ETL) and a cathode layer 106 have been deposited in sequence. In FIG. 1, the emission layer 104 consists of three separate emission layers, which each emit light individually in different colors (e.g. red, green, blue) and can generate white light.

The organic light emitting layers emit light if a voltage is applied between anode and cathode. The applied voltage at the electrodes results in charge carrier injection in the organic material. This leads to charge carrier transport into the emission zone, where a recombination of the charge carriers takes place and the light emission is subsequently brought about.

In order to enable an electrical contact-connection of cathode and anode and also a current flowing through the emissive layers, the individual layers are not constructed over the whole area, but rather are deposited in a patterned fashion. One possibility for patterned deposition is disclosed by the document U.S. Pat. No. 7,049,757, which discloses a coating by means of shadow masks concomitantly guided with the substrate. Furthermore, the prior art in the document US 2005/0236975 A1 describes a patterning method in which the deposited layer is ablated by means of a laser. A further possibility for patterned deposition is lithographic/wet-chemical patterning, in particular for patterning the first bottom electrode applied on the substrate. These known methods have the disadvantage of complex handling of the concomitantly moving shadow masks and are unsuitable for the coating of flexible continuous substrates in the roll-to-roll method.

BRIEF SUMMARY OF INVENTION

It is an object of the present invention to increase the efficiency of inline vacuum treatment installations during the production of organic light emitting illuminants and in this case to simplify the steps for producing an electrical contact-connection for the cathode and anode. In this case, production is intended to be possible in a cost-effective manner, in particular in a commercially applicable manner, and with a higher throughput than heretofore.

The method according to the invention for the production of an organic light emitting illuminant is distinguished by the fact that the layers are deposited in strip-type fashion, wherein the layers are formed in strip-type fashion by means of coating in an inline vacuum coating installation with stationary shadow masks on the substrate guided past, such that at least one region of the bottom electrode layer remains uncoated after the layers have been formed, that is to say that at least one region of the bottom electrode layer is free of the subsequent coating after the layers have been formed. The layers formed in strip-type fashion include at least one organic light emitting layer, a top electrode layer and a conductor track layer. The wording that at least one region of the bottom electrode layer remains uncoated after the layers have been formed means that in each case after a strip-type coating of these layers, at least one region of the bottom electrode remains free of the coating. That means that, after the last layer has been deposited, at least one region of the bottom electrode is free of the coating.

With regard to the present invention, an "inline process control" means a physical transport of the substrate from one coating station to the next, in order to apply different layers, wherein the substrate is also transported further during the coating process. The method can be implemented in continuous installations with a continuously transporting substrate belt, either a continuous substrate in roll-to-roll coating or a quasi-continuous succession of synchronously moved successive planar package-type substrates.

In one advantageous development of the method according to the invention, the method comprises the step of forming an optional insulating smoothing layer above the substrate before the step of forming the bottom electrode layer. An insulating smoothing layer should be understood to be, for example, a lacquer for smoothing the substrate surface in order to avoid short circuits in and between the components in the case of rough surfaces. Preferably, the smoothing layer is formed above the substrate in planar fashion.

In one advantageous development of the method according to the invention, the method comprises the step of patterning the bottom electrode layer by means of a laser before the step of forming at least one organic light emitting layer. In the regions of the bottom electrode layer which have been treated by means of a laser, the material of the bottom electrode layer is removed as far as the substrate, optionally as far as the smoothing layer, with the result that regions of the bottom electrode layer which are electrically insulated from one another are formed. Preferably, for a respective organic light emitting illuminant, bottom electrode layers are separated into two regions of the bottom electrode layer, which are electrically insulated from one another. In this case, at least one portion of the regions that are electrically insulated from one another will remain uncoated by the subsequent application of the layers, that is to say free of the subsequent coating.

As a result, a method is provided which combines the patterning methods, namely the laser patterning, and coating by means of stationary strip masks with one another in order to produce contact-connectable OLED components in a simple manner. This combination of processes can be carried out on a continuously moved continuous substrate or a quasi-continuous succession of substrate wafers in an inline coating installation, without stopping the substrate in front of the coating sources or the patterning stations and without concomitantly moving shadow masks.

In a further advantageous development of the method according to the invention, the method comprises the step of patterning at least one organic light emitting layer by means of a laser before the step of forming the top electrode layer. In this case, at least one organic light emitting layer can subsequently be laser-patterned after its patterned deposition by means of the shadow mask.

In accordance with a further advantageous development of the method according to the invention, the method comprises, after the step of forming the top electrode layer and the subsequent conductor track layer, the step of patterning them by means of the laser. As a result, regions of the top electrode layer and of the conductor track layer that are electrically insulated from one another can be separated.

According to the invention, the coating of the respective layer is effected by coating sources which are arranged below the line guidance of the substrates, that is to say which point substantially vertically upward. In this case, the substrate is guided horizontally past the coating sources, such that the coating direction runs vertically. In this case, the terms "horizontally" and "vertically" are also intended to include deviations of up to 20% from the actual horizontal and vertical, respectively, that is to say to mean that the substrate in this case is guided substantially horizontally past the coating sources, such that the coating direction runs substantially vertically. In this way, it is possible to use coating installations in which the coating sources are aligned vertically with respect to their coating direction and in which horizontal substrate transport is effected. This simplifies the handling of the substrate during transport, since said substrate can now be guided by means of transport rollers, for example.

Alternatively, other spatial relations between substrate, sources and coating direction can also be employed, for example vertically oriented substrates with a horizontal coating direction.

According to the invention, at least one stationary shadow mask is arranged between a respective coating source and in each case the substrates guided past. In this case, each stationary shadow mask has at least one strip-type opening through which a dynamic coating of the layers on the substrates guided past or moved past with strip-shaped structures is effected. As a result, it is possible to avoid the complex handling of concomitantly moving shadow masks.

With the aid of the stationary shadow masks, layers are deposited, such as the organic light emitting layers, the top electrode layer and the conductor track layer. The bottom electrode layer can be applied in planar or strip-type fashion. In the case where the bottom electrode layer is formed in strip-type fashion, a stationary shadow mask is provided between the corresponding coating source and the substrate guided past.

According to the invention, coating methods used include sputtering or thermal evaporation. Preferably, the layers, such as the bottom electrode layer, the organic light emitting layers, the top electrode layer and the conductor track layer, are formed by vapor deposition. The bottom electrode layer can optionally be deposited by means of sputtering inline or in an external installation.

In accordance with at least one embodiment of the invention, at least one of the electrode layers comprises a transparent conductive layer or a metal, preferably silver (Ag), or consists thereof. On account of its electrical conductivity, silver has very good properties as an electrode. In a further configuration of the method according to the invention, the bottom electrode layer is embodied as a transparent conductive layer. If the electrode layer which comprises the metallic layer or consists thereof is intended to be embodied as transmissive to the light emitted by the organic layer stack, then the metallic layer has to be made sufficiently thin. Preferably, the thickness of a semitransparent metallic layer is approximately 100 nm.

In accordance with at least one embodiment of the illuminant, the conductor track layer has at least one electrically conductive track which preferably comprises a metal or consists thereof. The electrically conductive track constitutes an electrical connection to the top electrode layer and can serve as a first contact region. The second contact region is correspondingly conductively connected to the second electrode, that is to say to the bottom electrode layer of the illuminant— for example via second electrical leads.

In one advantageous configuration of the method according to the invention, the method comprises, in the step of forming at least one organic light emitting layer in strip-type fashion, advantageously a plurality of, preferably three separate, organic light emitting layers, for forming an organic light emitting layer stack. In this case, an organic layer is in each case suitable for generating light in a different color in each case, for example red, green or blue.

In a further advantageous configuration of the method according to the invention, the organic light emitting layer stack comprises further organic layers, preferably a hole transport layer and an electrode transport layer. In this case, the layers are also formed in strip-type fashion, such that at least one region of the bottom electrode layer is free of the coating.

It is conceivable for the organic layer stack to comprise, besides the organic light emitting layer, further organic layers, such as, for example, a hole injecting layer, a hole transport layer, an electron blocker layer, an electron injecting layer, an electron transport layer and a hole blocker layer. In this case, the hole injecting layer, the hole transport layer and electron blocker layer are preferably arranged on the side of the organic layer stack facing the anode, while the electron injecting layer, the electron transport layer and the hole blocker layer are preferably arranged on that side of the organic layer stack which faces the cathode. In this case, the organic light emitting layer is preferably arranged between the electron blocker layer and the hole blocker layer. With the use of a plurality of light emitting layers, further electrical functional layers can be arranged between them.

BRIEF DESCRIPTION OF DRAWING FIGURES

The invention is explained in greater detail below on the basis of preferred exemplary embodiments with reference to drawings, in which:

FIGS. 2a-2d show plan views of the layer structure for individual steps of the method for the production of the organic light emitting illuminant, and FIG. 3 shows a cross-sectional view of an organic light emitting illuminant produced by the method according to the invention.

DETAILED DESCRIPTION

The method according to the invention involves an inline vacuum coating installation in which the substrates or a large-area substrate are or is moved through the coating or processing stations and a plurality of organic light emitting illuminants are produced on said substrates/substrate. Although FIGS. 2a to 2d illustrate four OLED structures on the substrate, the arrangement and number of the structures are not limited to this example, but a different combination of the OLED structures is also conceivable.

The first step of the method according to the invention involves providing a substrate 200. The substrate 200 comprises aluminum or consists thereof. Its thickness is in the range of between 0.2 and 0.5 mm. The substrate is moved in a longitudinally extended vacuum coating installation with a substrate transport system (not illustrated) through the vacuum coating installation in a transport direction through various processing stations.

Figure 1:
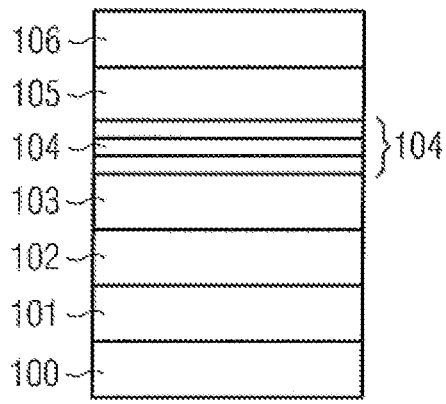
FIG. 1 shows a schematic construction of an organic light emitting illuminant according to the prior art.
Figure 2A:
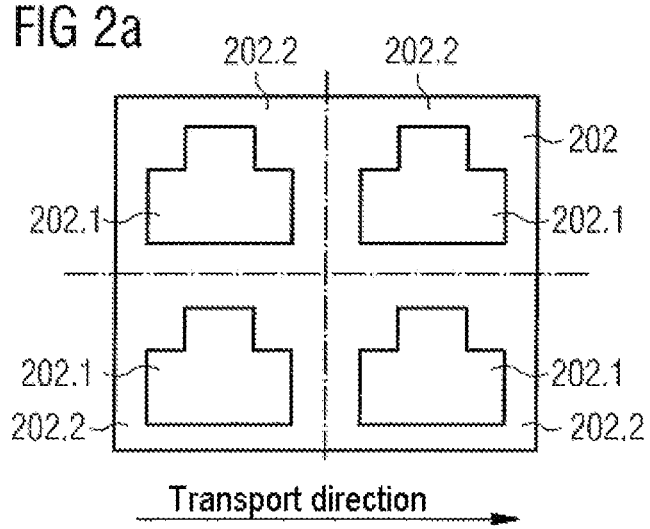

In the next step, a smoothing layer 201 is optionally applied over the substrate 200. A smoothing layer 201 should be understood to be, for example, a lacquer for smoothing the substrate surface in order to avoid short circuits in and between the components in the case of rough surfaces of the substrate. Preferably, the smoothing layer 201 is formed above the substrate in a planar fashion. In the next step of the method according to the invention, a bottom electrode layer 202 is formed over the smoothing layer 201 in a planar fashion. The coating of the bottom electrode layer 202 can be effected by means of sputtering inline in the vacuum coating installation or in an external installation. It is also possible for the bottom electrode layer 202 to be formed by means of thermal evaporation. The bottom electrode layer 202 comprises silver (Ag) or consists thereof. After the process for coating the bottom electrode layer 202 has ended, the bottom electrode layer 202, also called base electrode layer, can optionally be patterned by means of a laser. FIG. 2a illustrates four identical structures (marked in black), in each case two in an upper and two in a lower part of the substrate, which were patterned by means of a laser, the center line running parallel to the transport direction of the substrate. The structures are arranged symmetrically with respect to one another along the center line and transversely with respect to the transport direction of the substrate. The regions marked in black, as can be seen in FIG. 3, constitute the regions of the bottom electrode layer 202 which were removed by means of a laser as far as the smoothing layer 201 or optionally as far as the substrate 200. As a result, regions of the bottom electrode layer 202 that are electrically insulated from one another have been separated for the respective organic light emitting structure (OLE structure). The inner region of each of the four structures in each case constitutes a first electrically insulated region 202.1. The region arranged in each case around one of the four structures in the form of a rectangle, also called outer region hereinafter, in each case constitutes the second electrical region 202.2, insulated from the first region. The size of the respective rectangle corresponds to a quadrant of the substrate area.

Figure 2B:
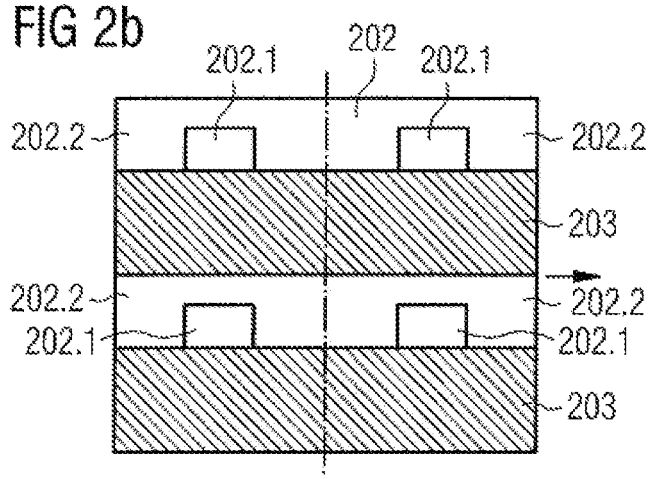

In FIG. 2b, in the next step, at least one organic light emitting layer (emission layer) 203 is deposited in strip-type fashion over the bottom electrode layer 202. The OLE layer 203 is deposited inline by thermal evaporation. The layer thickness is approximately 200 nm. Further OLE layers 203.2, 203.3 can also be applied in strip-type fashion. The strip-type deposition in FIG. 2b is effected in each case in the upper and also in the lower part of the substrate with respect to the center line of the substrate, said center line running parallel to the transport direction of the substrate. In this case, it is important that at least one region of the bottom electrode layer 202 for in each case one of the four structures remains free of the coating, wherein the region for the respective structure has at least one region of the inner region 202.1 and outer region 202.2 of the structure. These two regions 202.1 and 202.2 are electrically insulated from one another. Since the emission layer 203 is likewise deposited over one of the regions of the bottom electrode layer 202 (marked in black) by virtue of the fact that the material of the bottom electrode layer 202 was removed as far as the substrate 200, optionally as far as the smoothing layer 201, by means of laser patterning, a part of the emission layer 203 is thus deposited directly on the substrate 200, or on the smoothing layer 201. Optionally, the OLED layers 203 can also be patterned by means of a laser (not illustrated).

In the next step of the method according to the invention, which is illustrated in FIG. 2c, a top electrode layer 204 is coated in strip-type fashion over at least one region of the OLE layer 203, such that at least another region of the one layer of the OLE layer 203 remains free of the coating and the OLE-layer-free region of the bottom electrode layer 202 is not covered either. The top electrode layer 204 comprises silver or consists thereof. The coating is effected by thermal evaporation in the inline vacuum coating installation through an opening in the stationary shadow mask. The strip-type deposition in FIG. 2c is effected in each case in the upper and also in the lower part of the substrate with respect to the center line of the substrate, said center line running parallel to the transport direction. Optionally, the top electrode layer 202 can be patterned by means of a laser for the purpose of separating top electrode regions that are electrically insulated from one another (not illustrated).

The next step of the method according to the invention, as illustrated in FIG. 2d, comprises applying conductor tracks 205 in strip-type fashion, wherein at least that region of the bottom electrode layer 202 which is free of OLE layers remains free of the conductor track coating. Preferably, the conductor track coating 205 is formed on the OLE layer 203 such that the OLE layer 203 projects on both sides transversely with respect to the transport direction of the substrate 200 below the top electrode layer 204 and conductor track coating 205, in order to avoid a short circuit between bottom electrode layer 202 and top electrode layer 204. The conductor track layer 205 constitutes at least one electrically conductive track which preferably comprises metal or consists thereof. It generally has a good electrical conductivity, such that it is particularly well suited to impressing charge carriers into the organic layer stack. Furthermore, the metallic track in FIG. 2d is preferably embodied such that, from the area of the electrode encompassing it, it takes up only a small part of the top electrode layer. It constitutes an electrical connection to the top electrode layer and can serve as a contact region. The second contact region is correspondingly conductively connected to the second electrode, that is to say to the bottom electrode layer of the illuminant—for example via second electrical leads.

Optionally, the conductor track layer can be patterned by means of a laser (not illustrated). The method makes it possible for a plurality of OLE illuminants to be produced identically in an inline vacuum coating installation.

An OLE illuminant produced by the method according to the invention comprises according to FIG. 3 a substrate 200, on which a layer system is constructed. The layer system comprises in succession a smoothing layer 201, a bottom electrode layer 202, patterned by means of a laser, an OLE layer 203, a top electrode layer 204 and a conductor track layer 205. On account of the laser patterning, the patterned bottom electrode layer 202 comprises two regions 202.1, 202.2, which are electrically insulated from one another. On account of the laser patterning, the material of the bottom layer electrodes 202 was removed as far as the smoothing layer 201, which resulted in a trench being produced in the bottom electrode layer 202, said trench separating the two regions 202.1, 202.2 from one another. The OLE layer consists of three separate OLE layers 203.1, 203.2, 203.3, wherein each layer emits the light in a different color. The layers 203.1, 203.2, 203.3, 204, 205, 206 were deposited such that at least one region of the bottom electrode layer is free of the coating. This region of the bottom electrode layer comprises a portion of the two regions 202.1, 202.2 of the bottom electrode layer that are electrically insulated from one another. Since the OLE layers are likewise deposited over one of the regions of the bottom electrode layer which was patterned by means of a laser, a part of the emission layer is deposited in the region of the trench produced on account of the laser patterning directly on the smoothing layer. The strip-type top electrode layer 204 is deposited such that at least the OLE-layer-free region of the bottom electrode layer and at least one region of the OLE layer are free of the coating thereof. The conductor track layer 205 is likewise formed in strip-type fashion. In this case, it is preferably formed such that it takes up only a small part of the area of the top electrode 204.

The invention claimed is:

1. A method for producing an organic light emitting illuminant, comprising the steps of
   providing a substrate
   forming a bottom electrode layer above the substrate,
   forming at least one organic light emitting layer in strip-type fashion above at least one part of the bottom electrode layer,
   forming a top electrode layer in strip-type fashion above at least one part of the at least one organic light emitting layer; and
   forming a conductor track layer in strip-type fashion,
   wherein the at least one organic light emitting layer, the top electrode layer and the conductor track layer are formed in strip-type fashion by coating in an inline vacuum coating installation with respective stationary shadow masks at successive coating stations as the substrate is guided past the masks in a transport direction, without stopping the substrate in front of the coating stations, wherein each respective stationary shadow mask is provided with a strip-type opening extending in the substrate transport direction such that each layer formed in strip-type fashion is formed by dynamic coating as the substrate is guided past the respective stationary shadow mask, such that at least one region of the bottom electrode layer remains uncoated after the at least one organic light emitting layer, the top electrode layer and the conductor track layer have been formed.

2. The method as claimed in claim 1, further comprising the step of forming a smoothing layer above the substrate before the step of forming the bottom electrode layer.

3. The method as claimed in claim 1, further comprising the step of patterning the bottom electrode layer by a laser before the step of forming at least one organic light emitting layer.

4. The method as claimed in claim 3, wherein the step of patterning the bottom electrode layer by a laser separates regions that are electrically insulated from one another.

5. The method as claimed in claim 1, further comprising the step of patterning the at least one organic light emitting layer by a laser before the step of forming the top electrode layer.

6. The method as claimed in claim 1, further comprising, after the step of forming the top electrode layer and the subsequent conductor track layer, the step of patterning the top electrode layer and the conductor track layer by a laser.

7. The method as claimed in claim 6, wherein the step of patterning the top electrode layer by a laser separates regions of the top electrode layer that are electrically insulated from one another.

8. The method as claimed in claim 1, wherein the substrate is guided past coating sources in a horizontal line guidance, such that a coating direction runs vertically.

9. The method as claimed in claim 1, wherein the stationary shadow masks are arranged between coating sources and the substrate guided past the coating sources.

10. The method as claimed in claim 1, wherein the bottom electrode layer, the at least one organic light emitting layer, the top electrode layer and the conductor track layer are formed by vapor deposition or sputtering.

11. The method as claimed in claim 1, wherein at least one of the bottom electrode layer and the top electrode layer comprises a transparent conductive layer or metal.

12. The method as claimed in claim 1, wherein the conductor track layer has at least one electrically conductive track comprising a metal.

13. The method as claimed in claim 1, wherein the step of forming at least one organic light emitting layer in strip-type fashion, comprises forming organic layers in an organic light emitting layer stack, wherein each organic layer generates light in a different color.

14. The method as claimed in claim 13, wherein the organic light emitting layer stack further comprises a hole transport layer (HTL) and an electron transport layer (ETL).

15. The method as claimed in claim 1, wherein the bottom electrode layer is formed in a planar or strip-type fashion.

16. The method as claimed in claim 11, wherein the metal comprises silver.

* * * * *